United States Patent
Kraemer et al.

(10) Patent No.: US 8,212,597 B2
(45) Date of Patent: Jul. 3, 2012

(54) METHOD FOR DETECTING THE LOCKING OF A PHASE-LOCKED LOOP AND ASSOCIATED DEVICE

(76) Inventors: Michael Kraemer, Lans en Vercors (FR); Sébastien Rieubon, Saint Jean de Moirans (FR)

( * ) Notice: Subject to any disclaimer, the term of this patent is extended or adjusted under 35 U.S.C. 154(b) by 301 days.

(21) Appl. No.: 12/688,098

(22) Filed: Jan. 15, 2010

(65) Prior Publication Data

US 2010/0176845 A1    Jul. 15, 2010

(30) Foreign Application Priority Data

Jan. 15, 2009    (FR) ..................... 09 50224

(51) Int. Cl.
*H03L 7/06* (2006.01)
(52) U.S. Cl. ........................ 327/156; 327/147
(58) Field of Classification Search ............ 327/147, 327/156
See application file for complete search history.

(56) References Cited

U.S. PATENT DOCUMENTS

| | | | |
|---|---|---|---|
| 5,396,522 A * | 3/1995 | Laflin | 375/364 |
| 5,703,539 A * | 12/1997 | Gillig et al. | 331/16 |
| 5,909,130 A | 6/1999 | Martin et al. | 327/12 |
| 6,785,354 B1 | 8/2004 | Dietrich | 375/373 |
| 7,936,196 B2 * | 5/2011 | Kim et al. | 327/158 |
| 2004/0095197 A1 | 5/2004 | Wang et al. | 331/100 |
| 2006/0280276 A1 | 12/2006 | Chen et al. | 375/376 |
| 2010/0176845 A1 * | 7/2010 | Kraemer et al. | 327/7 |
| 2010/0225369 A1 * | 9/2010 | Badaroglu | 327/158 |
| 2010/0226188 A1 * | 9/2010 | Kim et al. | 365/194 |
| 2011/0080528 A1 * | 4/2011 | Deleon | 348/731 |
| 2011/0181366 A1 * | 7/2011 | Schoepf et al. | 331/18 |
| 2011/0187422 A1 * | 8/2011 | Hammes et al. | 327/156 |
| 2011/0249702 A1 * | 10/2011 | Le-Gall | 375/130 |
| 2012/0026039 A1 * | 2/2012 | Ganeshan et al. | 342/357.73 |

* cited by examiner

*Primary Examiner* — Lincoln Donovan
*Assistant Examiner* — Adam Houston
(74) *Attorney, Agent, or Firm* — Allen, Dyer, Doppelt, Milbrath & Gilchrist, P.A.

(57) ABSTRACT

A method is for detecting locking of a phase-locked loop that generates an output signal and includes a phase comparator receiving, as an input, a reference signal and a second signal based upon the output signal. A time window having a duration of at least two periods of a third signal based upon the output signal, and located about a payload edge of the second signal, is generated. A first comparison of the reference signal and the second signal at a first payload edge of the third signal within the time window and on a first side of the payload edge of the second signal is performed. A second comparison of the reference signal and the second signal at a second payload edge of the third signal within the time window and on a second side of the payload edge of the second signal is then performed. Locking of the phase-locked loop based upon the reference signal and the second signal being equal during the first and second comparisons is detected.

17 Claims, 4 Drawing Sheets

METHOD FOR DETECTING THE LOCKING OF A PHASE-LOCKED LOOP AND ASSOCIATED DEVICE

FIELD OF THE INVENTION

The invention relates to the processing of an electronic signal, and, more particularly, to the detection of locking of a phase-locked loop.

BACKGROUND OF THE INVENTION

A phase-locked loop is an electronic system used to lock the instantaneous phase of an electronic output signal, originating from this phase-locked loop, to the instantaneous phase of an electronic input signal (reference signal) received by this same phase-locked loop. However, it is also used to lock a frequency of the output signal to a multiple of the frequency of the input signal. A phase-locked loop proceeds by incrementation or decrementation, of the frequency of a clock signal supplied by an internal oscillator, according to the phase shift that exists between the input and output signals.

A conventional phase-locked loop usually comprises a phase comparator receiving the reference signal and a second signal originating from the output signal, a charge pump, a loop filter, a voltage-controlled oscillator, and a frequency divider.

A fractionary phase-locked loop differs from a conventional phase-locked loop in that, instead of an integer division ratio frequency divider, it comprises a fractionary frequency divider, that is to say with a division that is not integer.

There are several, more or less robust, and/or more or less time-consuming and space-consuming ways of detecting the locking of a phase-locked loop.

A first known approach includes applying a frequency model by using two counters counting respectively the payload edges of each of the two input signals in the phase comparator, namely the reference signal and the second signal (or the comparison signal originating) from the frequency divider.

In this type of locking detection model, since the averages of the frequencies are compared, the reference and comparison signals are analyzed for a relatively long time in order to improve the probability of stability of the comparison signal, and therefore the probability that the phase-locked loop will be properly locked. Because of the time used to detect locking, this type of detection model may delay the starting of the system controlled by the phase-locked loop. Moreover, the more important the accuracy of desired detection, the more space the counters used for the reference signal and for the comparison signal take up in the device.

A second approach that is also known includes using two D flip-flops with delays imposed by a capacitor load, and an AND logic port.

The systems for detecting the locking of a phase-locked loop of this type pose issues with robustness relative to variations in production process, voltage and temperature, and are subject to phenomena of local overvoltage (known as "glitches"), thereby adversely affecting the accuracy of detection which is highly dependent on the variation of these parameters. For a fractionary PLL, the division is not integer division and is therefore not constant. Since the ratio changes, the instantaneous period is not fixed. This gives the impression that the PLL is not locked.

A third known approach involves using a counter which makes it possible to disable the output of the phase-locked loop for a fixed time and to consider the PLL locked after this fixed time without analyzing the signals, which may sometimes be false.

However, the devices based on this approach are time-consuming for the phase-locked loop and costly in terms of physical space occupied. Furthermore, these devices also pose problems of robustness relative to variations in production process, voltage and temperature.

SUMMARY OF THE INVENTION

According to methods of application and implementation, a method and a device for detecting the locking of a phase-locked loop are disclosed that make it possible to reduce energy consumption and that apply equally to integer phase-locked loops and fractionary phase-locked loops. Also disclosed are a method and a device that can offer an adjustable locking threshold making it possible to adjust the reliability of detection of locking.

According to one embodiment, the device is not very costly in terms of space and can be included in the digital device for controlling the phase-locked loop. It is also not very sensitive to variations in production process, voltage and temperature and is more robust than the solutions of the prior art.

This embodiment advantageously detects the locking of a phase-locked loop by opening a time window, during which the arrival of payload input-signal edges from the phase comparator of a phase-locked loop is observed.

According to one aspect, a method is for detecting the locking of a phase-locked loop, generating an output signal, and comprising a phase comparator receiving as an input a reference signal and a second signal (which may also be called, for example, a comparison signal) originating from the output signal.

According to a general feature, the method may comprise successive executions of steps a) to c) as follows:

a) a generation of a time window having a time width equal to at least two periods of a third signal originating from the output signal and centered on a payload edge of the second signal (the third signal may correspond directly to the output signal or indirectly to the output signal, for example, to the output signal having undergone a frequency division);

b) a first comparison between the value of the reference signal and the value of the second signal for a first payload edge of the third signal contained in the time window and situated on one side of the payload edge of the second signal;

c) a second comparison between the value of the reference signal and the value of the second signal for a second payload edge of the third signal successive to the first payload edge, contained in the time window and situated on the other side of the payload edge of the second signal; and d) a generation of a signal for detecting the locking of the phase-locked loop if, on each execution, the first and second comparisons reveal identical or similar values for the reference signal and the second signal.

By successively repeating steps a) to c), the user will be able to compare the values of the reference signal with the values of the second signal for the first and second payload edges for successive time windows. Therefore, if a locking of the phase-locked loop is detected for a time window, it is possible to verify that this locking is not an accident by checking the locking of the phase-locked loop for a number of successive time windows after this detection. The number of successive detections will be greater than or equal to two. The number of successive detections may be adjusted depending on the level of detection reliability desired.

Preferably, a time window is generated having a time width equal to two periods of the third signal and centered on a falling edge of the second signal, and, in steps b) and c), the value of the reference signal is measured.

According to another aspect, a device is for detecting the locking of a phase-locked loop generating an output signal and comprising a phase comparator receiving, as an input, a reference signal and a second signal originating from the output signal.

According to a general feature of this other aspect, this device comprises means or circuitry for generating a time window, which are suitable for generating a time window having a time width equal to at least two periods of a third signal originating from the output signal and centered on a payload edge of the second signal. The device includes comparison means or circuitry capable of carrying out a first and a second comparison between the value of the reference signal and the value of the second signal for, respectively, a first payload edge and a second payload edge in succession of the third signal contained in the time window and situated on either side of the payload edge of the second signal. Control means or circuitry are capable of activating several times in succession the generation means and the comparison means. Detection means or circuitry are capable of generating a signal for detecting the locking of the phase-locked loop if, on each activation of the comparison means, the first and second comparisons reveal identical or similar values for the reference signal and the second signal.

Preferably, the comparison means comprise a comparison module containing a detection flip-flop of the D type the clock input of which receives the time window signal, and a comparison logic module capable of carrying out an AND logic operation.

The means or circuitry for generating a time window preferably generate a time window with a time width corresponding to two periods of the third signal centered on a falling edge of the second signal. Advantageously, the comparison means comprise an analysis module measuring the value of the reference signal for the first payload edge and for the second payload edge.

The analysis module may advantageously comprise a first D flip-flop and a second D flip-flop. The clock input of the first flip-flop and the clock input of the second flip-flop each receives the output signal from a windowing logic module capable of carrying out an AND logic operation of the time window signal with the third signal. The first flip-flop receives as an input the reference signal, and the second flip-flop receives as an input the output signal of the first flip-flop.

In another embodiment, the analysis module may also comprise a first D measurement flip-flop and a second D measurement flip-flop each receiving as an input the reference signal. The clock input of the first measurement flip-flop receives an output signal of a first logic module capable of carrying out an AND logic operation of the third signal with a first analysis-authorization signal for the first payload edge of the third signal. The clock input of the second measurement flip-flop receives an output signal of a second logic module capable of carrying out an AND logic operation of the third signal with a second analysis-authorization signal for the second payload edge of the third signal.

BRIEF DESCRIPTION OF THE DRAWINGS

Other advantages and features will appear on examining the detailed description of methods of implementation and application, that are in no way limiting, and the appended drawings in which.

DETAILED DESCRIPTION OF THE PREFERRED EMBODIMENTS

Figure 1:
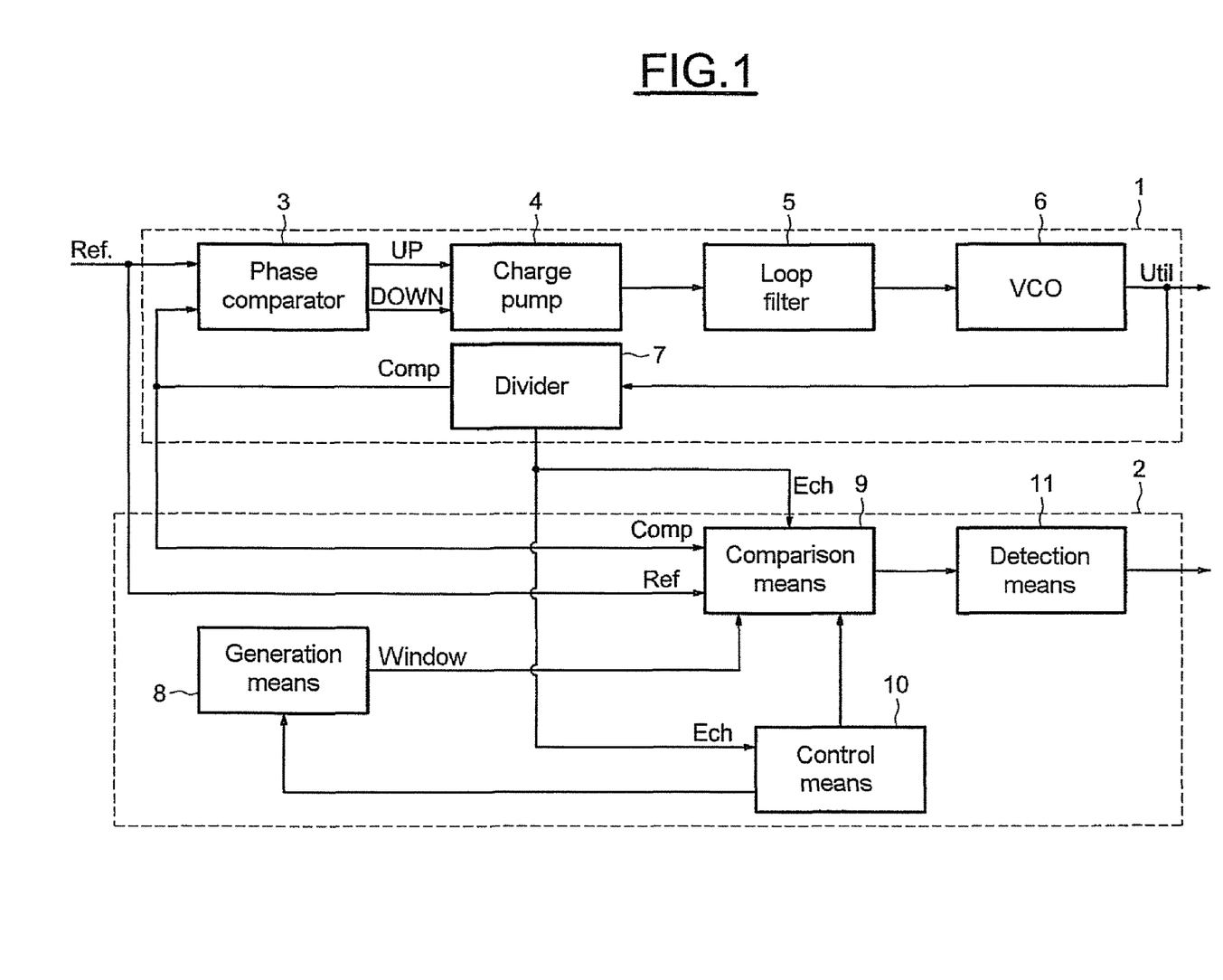
FIG. 1 represents schematically a phase-locked loop and an associated device for detecting the locking of the phase-locked loop, according to the present invention.

FIG. 1 represents schematically a phase-locked loop 1 that will hereinafter be noted PLL for Phase-Locked Loop, and a device 2 for detecting the locking of the phase-locked loop 1.

The PLL 1 comprises a phase comparator 3, a charge pump 4, a loop filter 5, a voltage-controlled oscillator 6, and a frequency divider 7. The phase comparator 3 of the PLL 1 receives, as an input, a reference signal Ref and a second signal originating from the output signal Util of the PLL 1. The frequency divider 7 of the PLL 1 delivers a second signal, which will hereinafter be called the comparison signal Comp, and a third signal Ech. These signals Comp and Ech are generated from the output signal Util, which the frequency divider 7 receives as an input. The third signal Ech corresponds to the output signal Util, or else to the output signal the frequency of which has been divided. In the latter case, the frequency of the signal may be equal to or different from that of the comparison signal Comp.

The phase comparator 3 compares the phases of the reference signal Ref and of the comparison signal Comp, and generates as an output a signal proportional to the phase difference between these two signals. The charge pump 4 then injects or removes charges into/from the loop filter 5 via two sources of current controlled by the input signals UP and DOWN originating from the phase comparator 3, in order to lock the phase of the comparison signal Comp with the phase of the reference signal Ref. The loop filter 5 makes it possible to stabilize the retroaction loop formed by the frequency divider 7, and to filter the intrinsic and extrinsic noise elements. The function of the voltage-controlled oscillator 6 is to generate a periodic output signal Util, the frequency of which is proportional to the voltage applied at its input. This output signal of the voltage-controlled oscillator 6 corresponds to the output signal Util of the PLL 1.

The device 2 for detecting the locking of the phase-locked loop 1 comprises means or circuitry 8 for generating a time window Window of the payload edges of the input signals of the phase comparator 3, means or circuitry 9 for comparing the comparison signal Comp and the reference signal Ref, means or circuitry 10 for controlling generation means or circuitry 8 and comparison means or circuitry 9, and detection means or circuitry 11.

The comparison means or circuitry 9 receives as an input the comparison signal Comp and reference signal Ref, and the time window Window and the third signal Ech, and are capable of verifying whether the phase of the comparison signal Comp is locked with the phase of the reference signal Ref. The control means or circuitry 10, controlled at the frequency of the third signal Ech delivered as an input of the control means or circuitry 10, activate the generation means or circuitry 8 and the comparison means or circuitry 9 in a repeated manner to produce several successive comparisons and thereby ensure the locking of the PLL 1. The detection means or circuitry 11 take account of this phase locking. When several lockings have been detected successively, the detection means or circuitry 11 deliver a signal indicating that the phase-locked loop is indeed locked if the values of the reference signal and of the second signal are similar or identical.

Figure 2:
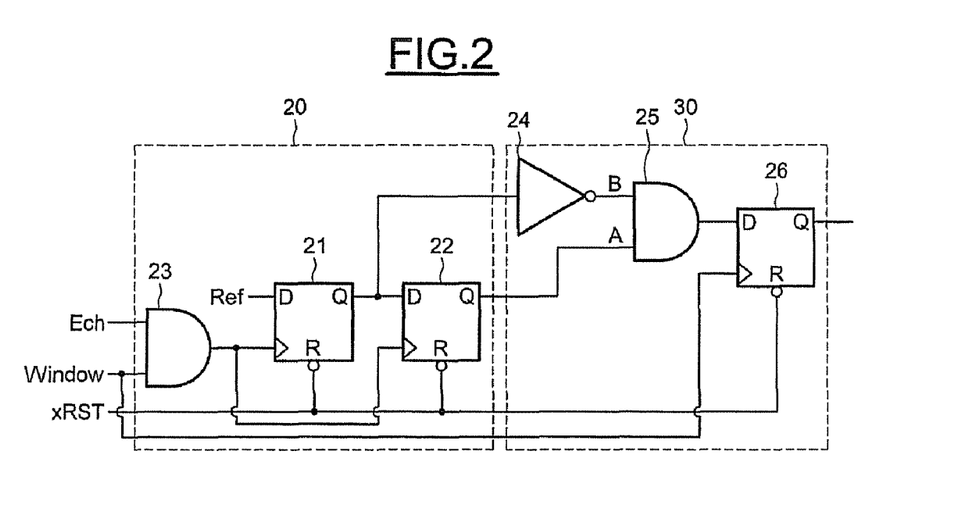
FIG. 2 represents schematically a first implementation of a portion of a device for detecting the locking of a phase-locked loop, according to the present invention.
Figure 3:
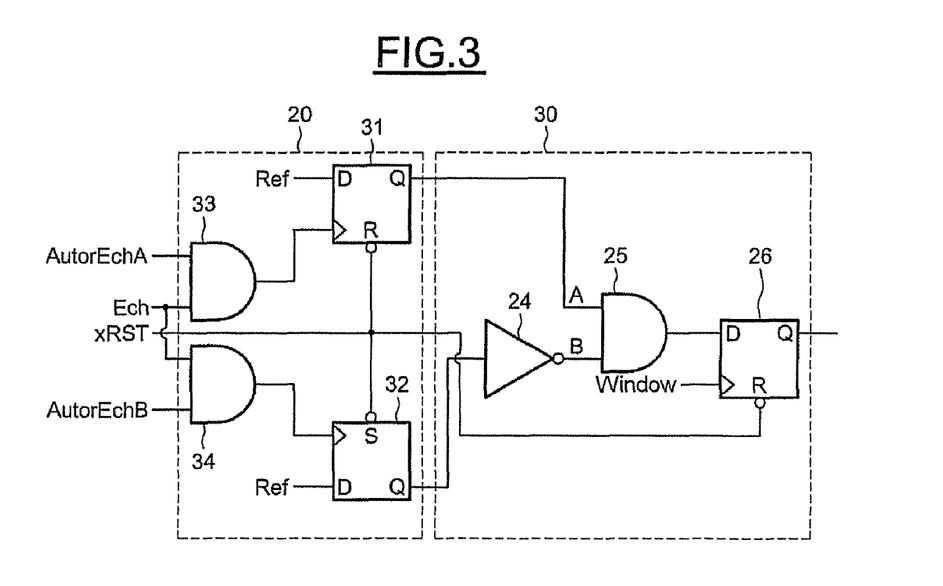
FIG. 3 represents schematically a second implementation of a portion of a device for detecting the locking of a phase-locked loop, according to the present invention.

In FIGS. 2 and 3, the time window Window is generated so as to be symmetrically distributed on either side of a payload edge of the comparison signal Comp and so as to be as narrow as possible timewise, that is to say that it is generated during two periods of the third signal Ech. The first payload edge A and the second payload edge B are thus contained in the analysis time window are distinct and successive. Therefore, by choosing a falling edge or a rising edge of the comparison signal Comp, the user already knows the value of the comparison signal Comp for the first payload edge A and for the second payload edge B. In the case of a falling edge, the comparison signal Comp will have a non-zero Boolean value for the first payload edge A, and a zero Boolean value for the second payload edge B. Conversely, in the case of a rising edge, the comparison signal Comp will have a zero Boolean value for the first payload edge A, and a non-zero Boolean value for the second payload edge B.

In this way, it is sufficient to determine the value of the reference signal Ref for the first payload edge A and for the second payload edge B, and to compare them with Boolean values determined as a function of the type of payload edge chosen for the comparison signal Comp.

FIG. 2 shows schematically a first possible implementation of the comparison means 9 of a device 2 for detecting the phase-locking of a PLL 1 according to a first exemplary embodiment.

In this first exemplary embodiment, the comparison means 9 comprise an analysis module 20, a first D flip-flop 21 and a second D flip-flop 22, and a windowing logic module 23 capable of carrying out an AND combination logic operation between the third signal Ech and the time window Window signal originating from the generation means or circuitry 8 for generating a time window of the payload edges of the input signals of the phase comparator 3. The windowing logic module 23 therefore makes it possible to define a time window synchronized with the third signal Ech.

The clock inputs of the first flip-flop 21 and of the second flip-flop 22 thus receive as an input the output signal of the windowing logic module 23. The first D flip-flop 21 and second D flip-flop 22 therefore analyze the reference signal Ref during the period corresponding to the time window Window generated by the generation means or circuitry 8 for generating a time window.

Therefore, when the time window Window is generated and the first payload edge A is generated, the first flip-flop 21 and the second flip-flop 22 are set in operation. Initially, the second flip-flop 22 copies as an output the value of the signal received as an input, that is to say the value RefA of the reference signal Ref for the first payload edge A, while the first flip-flop 21 copies a zero signal since the input signal is zero. Specifically no event has been registered beforehand.

During the next payload edge, the second payload edge B, the first flip-flop 21 copies as an output the value of the input signal which then corresponds to the value of the output signal of the second flip-flop 22 for the preceding payload edge, that is to say to the value RefA of the reference signal Ref at the time of the first payload edge A. The second flip-flop 22, for its part, copies as an output the value of the input signal, which then corresponds to the value RefB of the reference signal Ref for the second payload edge B.

The comparison means or circuitry 9 of a device 2 for detecting the phase-locking of a PLL 1 also comprise a comparison module 30 comprising a negation module 24, a comparison logic module 25, and a detection D flip-flop 26.

The negation module 24 receives as an input the signal originating from the second D flip-flop 22 and carries out a negation operation. Therefore, if the value of the signal originating from the second flip-flop 22 was non-zero, it will be zero at the output of the negation module 24, and if, on the other hand, the signal originating from the second flip-flop 22 had a zero value, the output signal of the negation module 24 will be zero.

The comparison logic module 25 receives as an input the signal originating from the negation module 24 and the signal originating from the first flip-flop 21. It then carries out an AND logic operation of the two input signals. Therefore, if the two signals are non-zero, that is to say if the signal originating from the first flip-flop 21 is non-zero and if the signal originating from the second flip-flop 22 is zero, then the output signal of the comparison logic module 25 will be non-zero. Otherwise, the signal emanating from the comparison logic module 25 is zero.

The signal originating from the comparison logic module 25 is then injected as an input of the detection flip-flop 26, which also receives as a clock input the output signal of the windowing logic module 23. Therefore, if the signal at the input of the detection flip-flop 26 is non-zero and the signal originating from the windowing module for controlling the clock of the detection flip-flop 26 is non-zero, then, since the detection flip-flop 26 copies the input signal as an output, the signal originating from the comparison module 30 will be non-zero, indicating thereby a one-off detection of locking of the PLL 1. Otherwise, the output signal is zero indicating that the PLL 1 is not locked.

If the comparison module 30 delivers a non-zero output signal, thereby indicating a one-off detection of locking of the PLL 1, the detection means or circuitry 11 increment counting means or circuitry (not shown). Once the detection means or circuitry 11 have received the signal for one-off detection of locking of the PLL 1 a number n of successive times fixed in advance, the PLL is then considered locked and a signal for detection of locking of the PLL 1 is generated by the detection means or circuitry 11.

FIG. 3 represents schematically a second possible implementation of the comparison means or circuitry 9 of a device 2 for detecting the phase-locking of a PLL 1 according to a second exemplary embodiment.

In this second exemplary embodiment, the analysis module 20 comprises a first measurement D flip-flop 31 and a second measurement D flip-flop 32. A first logic module 33 is for authorizing analysis and a second logic module 34 is for authorizing analysis, both of which are capable of carrying out an AND combination logic operation between the third signal Ech and an analysis-authorization signal for a payload edge.

The first analysis-authorization logic module 33 therefore makes it possible to define a first payload edge A of the third signal Ech on which a first measurement of the value of the reference signal Ref will be made. The second analysis-authorization logic module 34 makes it possible to define a second payload edge B of the third signal Ech on which a second measurement of the value of the reference signal Ref will be made.

The clock input of the first measurement D flip-flop 31 receives the signal originating from the first analysis-authorization logic module 33. Therefore, the first measurement flip-flop 31 will operate for the first payload edge A defined by the first analysis-authorization logic module 33. The first measurement D flip-flop 31 receives as an input the reference signal Ref and copies its value RefA as an output for the first payload edge A. Therefore, on the first payload edge A, if the reference signal Ref has a high logic level, namely a non-zero binary level, the signal resulting from the first measurement flip-flop 31 will be equal to a high logic level, namely a non-zero binary level. If, on the other hand, the reference signal Ref has a low logic level, that is a zero binary level, the signal resulting from the first measurement flip-flop 31 will be equal to a low logic level, or a zero binary level. The output of the first measurement flip-flop 31 will retain the value thus detected in memory until the beginning of a new analysis cycle with a new sampling authorization for a first payload edge A, the clock input receiving a zero signal between two cycles.

The clock input of the second measurement D flip-flop 32 receives the signal originating from the second analysis-authorization logic module 34. Therefore, the second measurement flip-flop 32 will operate for the second payload edge B defined by the second analysis-authorization logic module 34. The second measurement D flip-flop 32 receives as an input the reference signal Ref and copies its value RefB as an output for the second payload edge B. Therefore, on the second payload edge B, if the reference signal Ref has a high logic level, that is a non-zero binary level, the signal resulting from the second measurement flip-flop 32 will be equal to a high logic level, that is a non-zero binary level. If, on the other hand, the reference signal Ref has a low logic level, that is a zero binary level, the signal resulting from the second measurement flip-flop 32 will be equal to a low logic level, or a zero binary level.

In this second exemplary embodiment, the comparison module 30 of a device 2 for detecting the phase-locking of a PLL 1 is the same as in the first example illustrated by FIG. 2.

In this second exemplary embodiment, the negation module 24 receives as an input the signal originating from the second measurement D flip-flop 32 and carries out a negation operation. Therefore, if the value of the signal originating from the second measurement flip-flop 32 was non-zero, it will be zero at the output of the negation module 24, and if, on the other hand, the signal originating from the second measurement flip-flop 32 was zero, the output signal of the negation module 24 will be zero.

In this example, the comparison logic module 25 receives as an input the signal originating from the negation module 24 and the signal originating from the first measurement flip-flop 31. It then carries out an AND logic operation of the two input signals. Therefore, if the two signals are non-zero, that is to say if the signal originating from the first measurement flip-flop 31 is non-zero and if the signal originating from the second measurement flip-flop 32 is zero, then the output signal of the comparison logic module 25 will be non-zero. Otherwise, the signal resulting from the comparison logic module 25 is zero.

Figure 4:
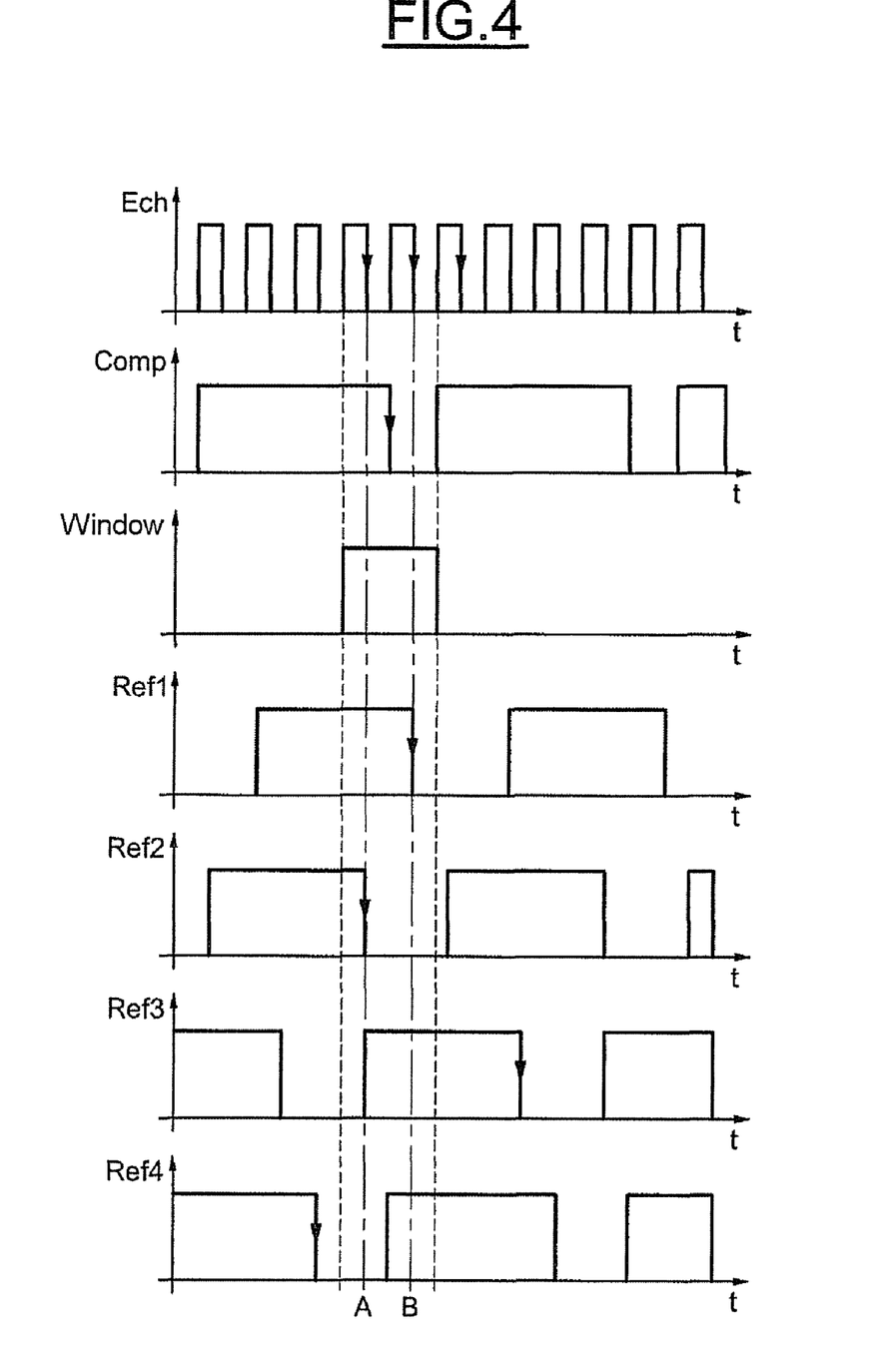
FIG. 4 shows an example of timing charts obtained during the detection of a locking of a phase-locked loop, according to the present invention.

FIG. 4 shows an example of timing charts obtained during the detection of a locking of a phase-locked loop. The first timing chart represents the time variation of the third signal Ech. The second timing chart represents the time variation of the comparison signal Comp that originates from the frequency divider 7 and that is delivered to the phase comparator 3 of the PLL 1. The third timing chart represents the time window Window of the payload edges open at the moment when it is desired to measure the value of the reference signal Ref. The last four timing charts represent the time variation of four examples of reference signals Ref1, Ref2, Ref3 and Ref4.

The payload edges used in this example are the falling edges for each of the signals. The time window Window is generated so as to be symmetrical timewise relative to a payload edge of the comparison signal Comp. In our example, the time window generated is symmetrically distributed on either side of a falling edge of the comparison signal Comp. To obtain good accuracy, it has been chosen in this example to take a time width for the time window that is equal to two periods of the third signal Ech.

The reference signal Ref is then measured for a first payload edge A and a second payload edge B in succession, contained in the time window Window. In the first example of a reference signal Ref1, the reference signal Ref1 is non-zero for the first payload edge A and zero for the second payload edge B. In the second example of a reference signal Ref2, the reference signal Ref2 is zero for the first payload edge A and for the second payload edge B. In the third example of a reference signal Ref3, the reference signal Ref3 is zero for the first payload edge A and non-zero for the second payload edge B. Finally, in the fourth and last example of a reference signal Ref4, the reference signal Ref4 is also zero for the first payload edge A and non-zero for the second payload edge B.

In these four examples, the case of the first example, namely the first reference signal Ref1, presents a case of locking the PLL 1. Specifically, the phase shift between the comparison signal Comp and the reference signal Ref1 is less than half a sampling period. If this shift is maintained for several periods of the reference signal, it is then considered that the PLL 1 is locked continuously.

It should be noted that it is sufficient to increase the frequency of the output signal Ech to increase the accuracy of detection of locking of the PLL 1.

Figure 5:
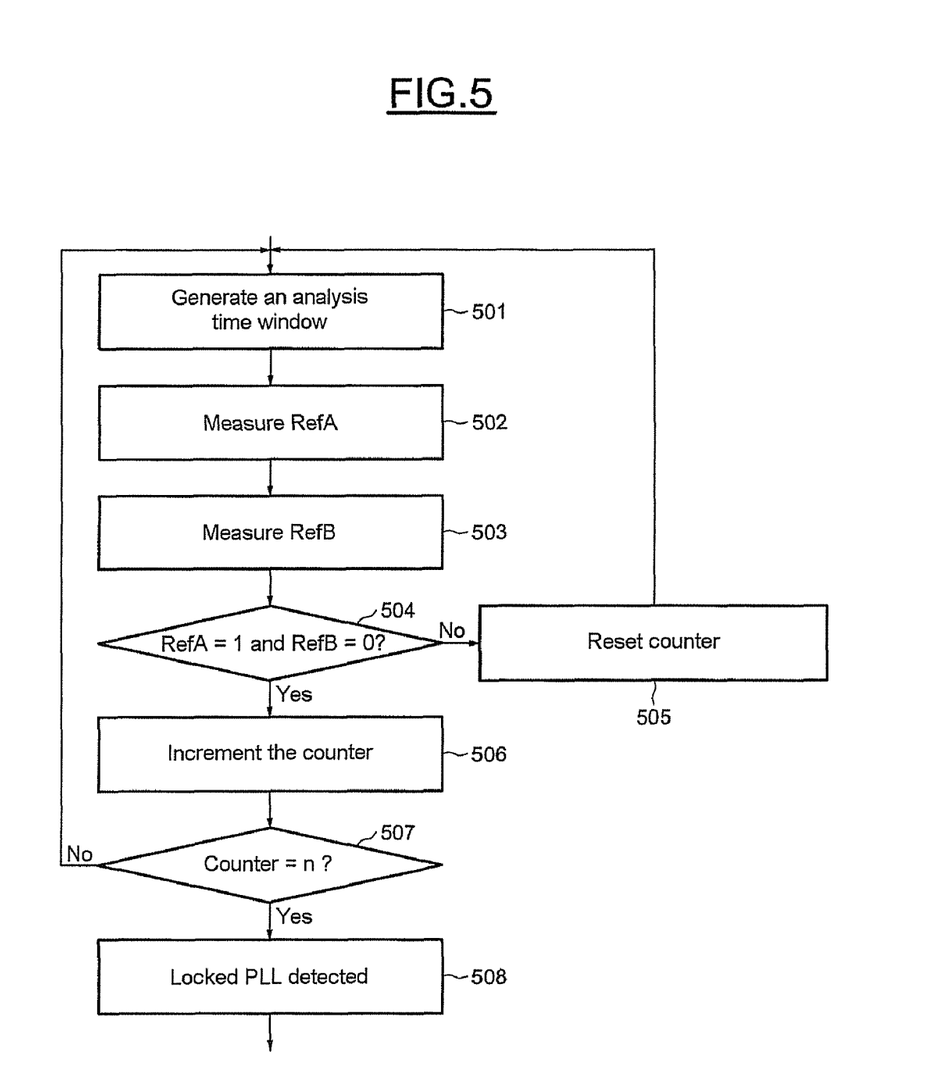
FIG. 5 shows a flow chart of a method for detecting the locking of a phase-locked loop according to one embodiment, according to the present invention.

FIG. 5 shows a block diagram of a method for detecting the locking of a phase-locked loop 1 according to one embodiment. In a first step 501, a time window Window of the payload edges is generated, the time window Window being generated so as to be symmetrically distributed on either side of a payload edge of the comparison signal Comp, and having a width timewise equal to at least two periods of the third signal Ech.

In a subsequent step 502, a first value RefA of the reference signal Ref is measured for a first payload edge A contained in the time window Window. In a next step 503, a second value RefB of the reference signal Ref is measured for a second payload edge B contained in the time window Window and successive to the first payload edge A of the sampling signal.

Then, in a step 504, the first value RefA of the reference signal Ref is compared with a non-zero Boolean value, and the second value RefB of the reference signal with a zero Boolean value. These comparison Boolean values are chosen in this way because the time window Window has been centered on a falling edge of the comparison signal Comp.

If the conditions of step 504 are not verified, the means for counting the detection means or circuitry 11 are reset, in a step 505, before returning to the first step 501.

Otherwise, in a step 506, the means or circuitry for counting the detection means or circuitry 11 is incremented. After step 506, a test is run to discover whether the means or circuitry for counting the detection means or circuitry 11 has reached a value n corresponding to a number n of successive repetitions during which the comparison signal Comp has been detected locked with the reference signal Ref. If the counting means has not reached the number n, the process begins again at the first step 501, otherwise, in a step 508, a signal indicating that the PLL 1 is locked is generated.

That which is claimed:

1. A method of detecting locking of a phase-locked loop that generates an output signal and comprises a phase comparator receiving, as an input, a reference signal and a second signal based upon the output signal, the method comprising:
   generating a time window having a duration of at least two periods of a third signal based upon the output signal, and located about a payload edge of the second signal;
   performing a first comparison of the reference signal and the second signal at a first payload edge of the third signal within the time window and on a first side of the payload edge of the second signal;
   performing a second comparison of the reference signal and the second signal at a second payload edge of the third signal within the time window and on a second side of the payload edge of the second signal; and
   detecting locking of the phase-locked loop based upon the reference signal and the second signal being equal during the first and second comparisons.

2. The method of claim 1, wherein the time window is generated centered on the payload edge of the second signal.

3. A method according to claim 1, further comprising generating another time window having a duration equal to two periods of the third signal and being centered on a falling edge of the second signal.

4. A method according to claim 1, wherein the generating, performing the first and second comparisons, and the generating are successively performed a plurality of times.

5. A method of detecting locking of a phase-locked loop that generates an output signal and comprises a phase comparator receiving, as an input, a reference signal and a second signal based upon the output signal, the method comprising:
   generating a time window having a duration of at least two periods of a third signal based upon the output signal, and centered on a payload edge of the second signal;
   performing a first comparison of the reference signal and the second signal at a first payload edge of the third signal within the time window and on a first side of the payload edge of the second signal;
   performing a second comparison of the reference signal and the second signal at a second payload edge of the third signal within the time window and on a second side of the payload edge of the second signal; and
   detecting locking of the phase-locked loop based upon the reference signal and the second signal being equal during the first and second comparisons;
   the generating, performing the first and second comparisons, and the generating being successively performed a plurality of times.

6. A method according to claim 5, further comprising generating another time window having a duration equal to two periods of the third signal and being centered on a falling edge of the second signal.

7. An electronic device for detecting locking of a phase-locked loop and generating an output signal, the electronic device comprising:
   a phase comparator receiving as an input a reference signal and a second signal based upon the output signal;
   generation circuitry configured to generate a time window having a time width equal to at least two periods of a third signal based upon the output signal;
   comparison circuitry configured to perform
      a first comparison of the reference signal and the second signal at a first payload edge of the third signal within the time window and on a first side of the payload edge of the second signal, and
      a second comparison of the reference signal and the second signal at a second payload edge of the third signal within the time window and on a second side of the payload edge of the second signal;
   control circuitry configured to activate the generation and comparison circuitry; and
   detection circuitry configured to generate a signal for detecting the locking of the phase-locked loop based upon the reference signal and the second signal being equal.

8. A device according to claim 7, wherein the generation circuitry is further configured to generate the time window centered on a payload edge of the second signal.

9. A device according to claim 7, wherein the comparison circuitry comprises a D flip-flop having a clock input that receives the time window, and a comparison logic module configured to perform a logic AND operation.

10. A device according claim 7, wherein the generation circuitry is further configured to generate another time window with a time width corresponding to two periods of the third signal and centered on a falling edge of the second signal.

11. A device according to claim 10, wherein the comparison circuitry comprises first and second D flip-flops having clock inputs each receiving the output signal from a windowing logic module configured to perform an AND logic operation of the time window signal with the third signal, the first D flip-flop receiving as an input the reference signal, and the second D flip-flop receiving as an input the output signal of the first D flip-flop.

12. A device according to claim 10, wherein the comparison circuitry comprises first and second D flip-flops having clock inputs and receiving as an input the reference signal, the clock input of the first D flip-flop receiving an output signal of a first logic module configured to perform an AND logic operation of the third signal with a first analysis-authorization signal for a first payload edge of the third signal, and the clock input of the second D flip-flop receiving an output signal of a second logic module configured to perform an AND logic operation of the third signal with a second analysis-authorization signal for a second payload edge of the third signal.

13. An electronic device for detecting locking of a phase-locked loop and generating an output signal, the electronic device comprising:
   a phase comparator receiving as an input a reference signal and a second signal based upon the output signal;
   generation circuitry configured to generate a time window having a time width equal to at least two periods of a third signal based upon the output signal and located about a payload edge of the second signal;
   comparison circuitry configured to perform
      a first comparison of the reference signal and the second signal at a first payload edge of the third signal within the time window and on a first side of the payload edge of the second signal, and
      a second comparison of the reference signal and the second signal at a second payload edge of the third signal within the time window and on a second side of the said payload edge of the second signal;
   control circuitry configured to activate the generation and comparison circuitry; and
   detection circuitry configured to generate a signal for detecting the locking of the phase-locked loop based upon the reference signal and the second signal being equal.

14. A device according to claim 13, wherein the comparison circuitry comprises a D flip-flop having a clock input that receives the time window, and a comparison logic module configured for performing a logic AND operation.

15. A device according claim 13, wherein the generation circuitry is further configured to generate another time window with a time width corresponding to two periods of the third signal and centered on a falling edge of the second signal.

16. A device according to claim 15, wherein the comparison circuitry comprises first and second D flip-flops having clock inputs each receiving the output signal from a windowing logic module configured to perform an AND logic operation of the time window signal with the third signal, the first D flip-flop receiving as an input the reference signal, and the second D flip-flop receiving as an input the output signal of the first D flip-flop.

17. A device according to claim 15, wherein the comparison circuitry comprises first and second D flip-flops having clock inputs and receiving as an input the reference signal, the clock input of the first D flip-flop receiving an output signal of a first logic module configured to perform an AND logic operation of the third signal with a first analysis-authorization signal for a first payload edge of the third signal, and the clock input of the second D flip-flop receiving an output signal of a second logic module configured to perform an AND logic operation of the third signal with a second analysis-authorization signal for a second payload edge of the third signal.

* * * * *

UNITED STATES PATENT AND TRADEMARK OFFICE
CERTIFICATE OF CORRECTION

PATENT NO. : 8,212,597 B2  
APPLICATION NO. : 12/688098  
DATED : July 3, 2012  
INVENTOR(S) : Kraemer et al.

Page 1 of 1

It is certified that error appears in the above-identified patent and that said Letters Patent is hereby corrected as shown below:

| | |
|---|---|
| Title Page, Item 76 | Should read --item (75)-- |
| Title Page, Item 73 | Insert --Assignee: STMICROELECTRONICS (GRENOBLE 2) SAS, Grenoble, (FR)-- |
| Column 10, Line 61, Claim 13 | Delete "the said" Insert --the-- |

Signed and Sealed this  
Twenty-sixth Day of February, 2013

Teresa Stanek Rea  
*Acting Director of the United States Patent and Trademark Office*